(12) United States Patent
Takeda et al.

(10) Patent No.: US 7,935,988 B2
(45) Date of Patent: *May 3, 2011

(54) METHOD OF MANUFACTURING SOLID STATE IMAGING DEVICE, SOLID STATE IMAGING DEVICE, AND CAMERA USING SOLID STATE IMAGING DEVICE

(75) Inventors: Takeshi Takeda, Kanagawa (JP);
Tadayuki Dofuku, Kumamoto (JP);
Kenji Takeo, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 12/468,593

(22) Filed: May 19, 2009

(65) Prior Publication Data
US 2009/0243017 A1   Oct. 1, 2009

Related U.S. Application Data

(62) Division of application No. 11/511,643, filed on Aug. 29, 2006.

(30) Foreign Application Priority Data

Sep. 5, 2005   (JP) ................................ 2005-256694
Sep. 22, 2005  (JP) ................................ 2005-275823

(51) Int. Cl.
*H01L 27/148* (2006.01)

(52) U.S. Cl. . 257/233; 257/294; 257/435; 257/E31.078; 257/E27.133; 438/60; 438/72

(58) Field of Classification Search .................. 257/233, 257/294, 432, 435, E27.133, E31.078, E31.084; 438/60, 72, FOR. 213; 216/46
See application file for complete search history.

(56) References Cited

U.S. PATENT DOCUMENTS
2007/0051874 A1*  3/2007  Takeda et al. .............. 250/208.1

FOREIGN PATENT DOCUMENTS

| JP | 61-29048 | 12/1986 |
|---|---|---|
| JP | 03-148176 | 6/1991 |
| JP | 05-152557 | 6/1993 |
| JP | 10-178166 | 6/1998 |
| JP | 11-289492 | 10/1999 |
| JP | 2001-308299 | 11/2001 |
| JP | 2002-319668 | 10/2002 |
| JP | 2002-324899 | 11/2002 |
| JP | 2005-228997 | 8/2005 |

* cited by examiner

*Primary Examiner* — Matthew S Smith
*Assistant Examiner* — Quovaunda Jefferson
(74) *Attorney, Agent, or Firm* — Robert J. Depke; Rockey, Depke & Lyons, LLC

(57) ABSTRACT

A method of manufacturing a solid state imaging device having a photo-electric conversion portion array and a transfer electrode array, these arrays being provided in parallel to each other, upper surfaces and side wall surfaces of the transfer electrode array being covered with a light-shielding layer, and a transparent layer showing an oxidizing property at the time of film formation, the transparent layer being formed on the photo-electric conversion parts and the light-shielding layer.

10 Claims, 8 Drawing Sheets

FIG. 7A
FIG. 7B
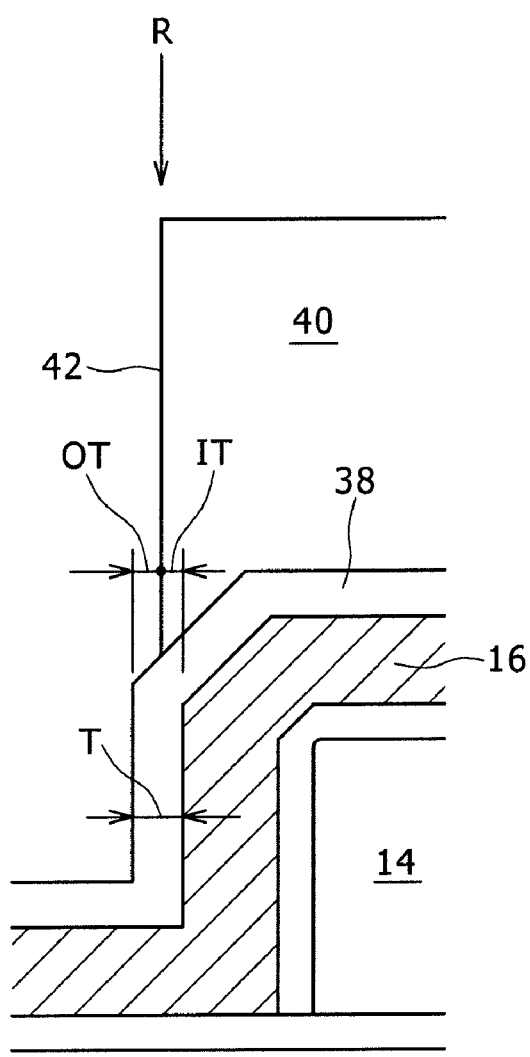
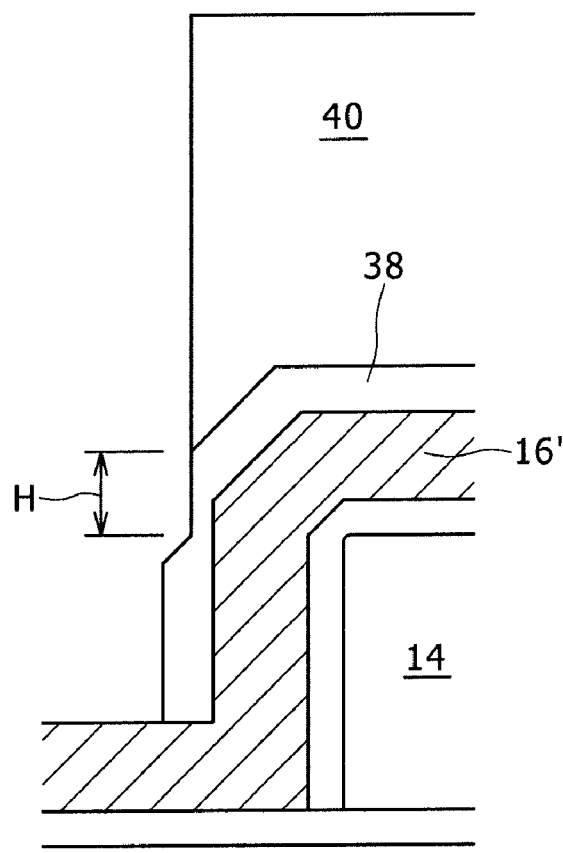

METHOD OF MANUFACTURING SOLID STATE IMAGING DEVICE, SOLID STATE IMAGING DEVICE, AND CAMERA USING SOLID STATE IMAGING DEVICE

CROSS REFERENCES TO RELATED APPLICATIONS

The subject matter of application Ser. No. 11/511,643, is incorporated herein by reference. The present application is a Divisional of U.S. Ser. No. 11/511,643, filed Aug. 29, 2006, which claims priority to Japanese Patent Application JP2005-275823 filed with the Japanese Patent Office on Sep. 22, 2005, and Japanese Patent Application JP2005-256694 filed with the Japanese patent Office on Sep. 5, 2005 the entire contents of which being incorporated herein by reference.

BACKGROUND OF THE INVENTION

1. Field of the Invention

The present invention relates to a method of manufacturing a solid state imaging device, the solid state imaging device, and a camera using the solid state imaging device.

2. Description of the Related Art

CCD solid state imaging devices used for area sensors and the like have a configuration in which a photo-electric conversion portion array including a plurality of photo-electric conversion parts and a transfer electrode array including a plurality of transfer electrodes are arranged in parallel to each other on a semiconductor substrate. The transfer electrode array is disposed on charge transfer paths formed in the semiconductor substrate, and the plurality of transfer electrodes are sequentially driven, whereby charges are transferred along the charge transfer paths.

Particularly, in a CCD solid state imaging device of the inter-transfer type, the transfer electrode array is covered with a light-shielding layer to prevent light from being incident on the charge transfer paths. The light shielding by the light-shielding layer is for preventing the smear phenomenon, i.e., the appearance of a line on a screen through a change in the amount of charges being transferred, which would occur if light is incident on the charge transfer path during transfer of a charge sequentially to the lower side of the transfer electrode in the adjacent pixel in a CCD solid state imaging device. As the material of the light-shielding layer, in general, such a metallic material as aluminum, tungsten and molybdenum is used. For forming the light-shielding layer, a light-shielding layer material layer is formed by sputtering or CVD on the semiconductor substrate provided with the photo-electric conversion parts and the transfer electrode array. As a result, the light-shielding layer material layer is formed not only on the upper surfaces and side wall surfaces of the transfer electrode array to be light-shielded but also on the surfaces on the photo-electric conversion parts. Subsequently, therefore, the light-shielding material on the photo-electric conversion parts is removed by etching so that the photo-electric conversion parts come to be able to receive light. A solid state imaging device having this kind of light-shielding layer is described, for example, Japanese Patent Laid-open No. Hei 10-178166.

SUMMARY OF THE INVENTION

The light shielding performance of a light-shielding layer is determined by the extinction coefficient of the material of the light-shielding layer and the thickness of the light-shielding layer. As the extinction coefficient of the material used is higher, the film thickness can be made smaller advantageously. At present, metallic materials such as aluminum, tungsten and molybdenum are generally used as the material of the light-shielding layer in CCD solid state imaging devices, and these metallic materials are known to have high extinction coefficients for visible rays. A light-shielding layer formed of tungsten may need a film thickness of around 200 nm in order to attain a light shielding performance for attenuating visible rays to −100 dB.

The photo-electric conversion parts in a CCD solid state imaging device are formed in valleys between large-height transfer electrodes on a semiconductor substrate. Of the transfer electrode array, both the upper surfaces and the side wall surfaces are covered with the light-shielding layer. Therefore, if the light-shielding layer is larger in thickness, the side wall surfaces of the transfer electrode array are bulged more accordingly, and the width of the valleys between the transfer electrodes becomes smaller. As a result, the aperture area of the photo-electric conversion parts is reduced, leading to a lower sensitivity. This is the reason for the fact that a light-shielding layer is more advantageous as its thickness is smaller. In addition, a reduction in the thickness of the light-shielding layer is important also for pursuing a further miniaturization of the solid state imaging device. Accordingly, it is desired to use a film material with a higher extinction coefficient as the material of the light-shielding layer.

As a material further higher than tungsten in extinction coefficient, ruthenium and iridium are known. For light with a wavelength region in the vicinity of 700 nm, tungsten has an extinction coefficient of 2.78 to 2.91, whereas ruthenium has 4.45 to 4.22 and iridium has 4.81 to 4.92. Thus, ruthenium and iridium are higher than tungsten in extinction coefficient by about 60%; therefore, when ruthenium or iridium is used, the thickness of the light-shielding layer can be reduced by about 60%, as compared with the case of using tungsten.

However, in the CCD solid state imaging device, after the formation of the light-shielding layer, a transparent layer composed of boron phosphorus silicate glass (BPSG) or phosphorus silicate glass (PSG) is formed thereon, for the purpose of forming a waveguide path or a lens. The BPSG film and the PSG film are transparent layers which show an oxidizing property at the time of film formation; particularly, these films show a strong oxidizing property in a heating reflow step included in the film forming process. On the other hand, ruthenium and iridium are materials liable to be oxidized; therefore, when the light-shielding layer is formed by use of ruthenium or iridium, the metallic material will be easily oxidized at the time of forming the transparent layer thereon. Particularly, when ruthenium (Ru) is converted into its oxide (RuOx), the extinction coefficient is lowered as compared with that of the elemental ruthenium, so that it becomes difficult to obtain the expected light shielding performance. In addition, part of ruthenium may be converted into volatile ruthenium tetroxide ($RuO_4$) and be evaporated, with also leads to local thinning of the light-shielding layer, accompanied by a lowering in light shielding performance at the thinned portion and a worsening of the smear characteristic.

Thus, there is a need to prevent a light-shielding layer from being oxidized at the time of forming a transparent layer, in manufacturing a solid state imaging device in which a photo-electric conversion portion array including a plurality of photo-electric conversion parts and a transfer electrode array including a plurality of transfer electrodes are provided in parallel to each other, the upper surfaces and side wall surfaces of the transfer electrode array are covered with the light-shielding layer, and the transparent layer showing an oxidizing property at the time of film formation is formed on the photo-electric conversion parts and the light-shielding layer.

FIGS. 9A to 9F are schematic sectional views illustrating a related-art process for forming a light-shielding layer covering a transfer electrode array. A photo-electric conversion portion array including a plurality of photo-electric conversion parts and the transfer electrode array 114 including a plurality of transfer electrodes are provided in parallel to each other on a semiconductor substrate. The extending direction of the photo-electric conversion portion array and the transfer electrode array is the direction orthogonal to the sheet surface of the drawings. As shown in the figures, the height of the surfaces of the photo-electric conversion parts 112 on the semiconductor substrate is roughly the same as the height of the bottom surfaces of the transfer electrode array 114, so that the side wall surfaces of the transfer electrode array 114 covered with a light-shielding layer 116 are rising on both sides of the photo-electric conversion part 112. In the process of forming the light-shielding layer illustrated in FIGS. 9A to 9F, the material of the light-shielding layer 116 is tungsten (W). On the semiconductor substrate provided with the photo-electric conversion portion array and the transfer electrode array 114, the W layer 116 is first formed (FIG. 8A). Next, after an $SiO_2$ layer as a back anti-reflection coat (BARC) is formed on the surface of the W layer 116 if needed, a photoresist material layer is formed, and the photoresist material layer is patterned, to form a photoresist mask 140 (FIG. 8B). Subsequently, anisotropic etching is conducted by use of the photoresist mask 140 as an etching mask, whereby tungsten covering the surfaces of the photo-electric conversion parts 112 is removed, to form openings 118 (FIG. 8C). The light-shielding layer 116 thus completed has a configuration in which edge portions 116a projecting largely from the lower ends of the side wall surfaces of the transfer electrode array 114 toward the photo-electric conversion parts 112 are formed at peripheral edges of the openings 118 formed in the light-shielding layer 116 in correspondence with the photo-electric conversion parts 112. According to the projection of the edge portions 116a, the aperture areas of the photo-electric conversion parts 112 are reduced, leading to a lowering in sensitivity.

FIGS. 9D and 9E illustrate a modified example of the above-described process. In the patterning, the size of the opening 142 formed in the photoresist material layer by the patterning is set to be equal to the spacing between the side wall surfaces of the transfer electrode array 114 mutually oppositely provided on both sides of the photo-electric conversion part 112, whereby formation of the edge portion 116a is obviated, and the aperture area of the photo-electric conversion part 112 is maximized. In this case, if misalignment in the patterning is not present at all, formation of the edge portion is completely precluded as shown in FIG. 9E, and all the problems are solved. In practice, however, the misalignment in the patterning of the photoresist mask is inevitable; due to the misalignment, as shown in FIG. 9F, the thickness of the light-shielding layer 116 covering the side wall surface on one side of the transfer electrode array 114 is reduced, thereby lowering the light shielding performance. Therefore, the edge portion 116a of the light-shielding layer 116 projecting largely toward the photo-electric conversion part 112 as shown in FIG. 9C has been an indispensable one as a method of providing a margin for absorbing the misalignment in the patterning of the photoresist mask, in the related-art process of forming the light-shielding layer. Then, the reduction in the aperture area of the photo-electric conversion parts 112 and the lowering in sensitivity, arising from the formation of such an edge portion 116a, have been the problems to which we could not but submit.

Thus, there is another need to ensure that the misalignment in patterning of a photoresist mask can be absorbed, without forming any edge portion projecting largely from the lower end of a side wall surface of a transfer electrode array toward a photo-electric conversion part at peripheral edges of the openings formed in a light-shielding layer in correspondence with the photo-electric conversion parts, and that the reduction in the aperture area of the photo-electric conversion parts and the lowering of sensitivity can be thereby obviated, in manufacturing a solid state imaging device in which the photo-electric conversion portion array including a plurality of photo-electric conversion parts and the transfer electrode array including a plurality of transfer electrodes are provided in parallel to each other, and the upper surfaces and side wall surfaces of the transfer electrode array are covered with the light-shielding layer provided with the openings corresponding to the photo-electric conversion parts.

In order to fulfill the above-mentioned need, according to an embodiment of the present invention, there is provided a method of manufacturing a solid state imaging device having a photo-electric conversion portion array including a plurality of photo-electric conversion parts and a transfer electrode array including a plurality of transfer electrodes, the photo-electric conversion portion array and the transfer electrode array being provided in parallel to each other, upper surfaces and side wall surfaces of the transfer electrode array being covered with a light-shielding layer, and a transparent layer showing an oxidizing property at the time of film formation, the transparent layer being formed on the photo-electric conversion parts and the light-shielding layer, wherein the method includes the steps of: forming a light-shielding layer material layer on a semiconductor substrate provided with the photo-electric conversion portion array and the transfer electrode array; forming an etching mask on the light-shielding layer material layer, and etching the light-shielding layer material layer so as to provide the light-shielding layer material layer with openings corresponding to the photo-electric conversion parts; forming an anti-oxidizing passivation layer on the photo-electric conversion parts and the light-shielding layer; and forming the transparent layer on the passivation layer.

According to another embodiment of the present invention, there is provided a method of manufacturing a solid state imaging device having a photo-electric conversion portion array including a plurality of photo-electric conversion parts and a transfer electrode array including a plurality of transfer electrodes, the photo-electric conversion portion array and the transfer electrode array being provided in parallel to each other, upper surfaces and side wall surfaces of the transfer electrode array being covered with a light-shielding layer, and a transparent layer showing an oxidizing property at the time of film formation, the transparent layer being formed on the photo-electric conversion parts and the light-shielding layer, wherein the method includes the steps of: forming a light-shielding layer material layer on a semiconductor substrate provided with the photo-electric conversion portion array and the transfer electrode array; forming a hard mask material layer on the light-shielding layer material layer; forming an etching mask on the hard mask material layer, and etching the hard mask material layer so as to provide the hard mask material layer with openings corresponding to the photo-electric conversion parts, thereby forming a hard mask; subjecting the light-shielding layer material layer to anisotropic etching by use of the hard mask as an etching mask so as to provide the light-shielding layer material layer with openings corresponding to the photo-electric conversion parts, thereby forming the light-shielding layer; forming an anti-oxidizing passivation layer on the hard mask, the photo-electric conversion parts, and the light-shielding layer exposed on the lower side of lower end portions of the hard mask; and forming the transparent layer on the passivation layer.

According to a further embodiment of the present invention, there is provided a solid state imaging device having a photo-electric conversion portion array including a plurality of photo-electric conversion parts and a transfer electrode array including a plurality of transfer electrodes, the photo-electric conversion portion array and the transfer electrode array being provided in parallel to each other, upper surfaces and side wall surfaces of the transfer electrode array being covered with a light-shielding layer, and a transparent layer showing an oxidizing property at the time of film formation, the transparent layer being formed on the photo-electric conversion parts and the light-shielding layer, wherein an anti-oxidizing passivation layer is formed between the light-shielding layer and the photo-conducive film.

According to yet another embodiment of the present invention, there is provided a solid state imaging device having a photo-electric conversion portion array including a plurality of photo-electric conversion parts and a transfer electrode array including a plurality of transfer electrodes, the photo-electric conversion portion array and the transfer electrode array being provided in parallel to each other, upper surfaces and side wall surfaces of the transfer electrode array being covered with a light-shielding layer, and a transparent layer showing an oxidizing property at the time of film formation, the transparent layer being formed on the photo-electric conversion parts and the light-shielding layer, wherein surfaces of portions covering upper surfaces of the transfer electrode array and portions covering upper regions of side wall surfaces of the transfer electrode array, of the light-shielding layer, are covered with a hard mask formed as an etching mask to be used in providing the light-shielding layer with openings corresponding to the photo-electric conversion parts by anisotropic etching; and an anti-oxidizing passivation layer is formed between surfaces of portions not covered with the hard mask, of the light-shielding layer, and the transparent layer, and between the surface of the hard mask and the transparent layer.

According to a yet further embodiment of the present invention, there is provided a camera using a solid state imaging device having a photo-electric conversion portion array including a plurality of photo-electric conversion parts and a transfer electrode array including a plurality of transfer electrodes, the photo-electric conversion portion array and the transfer electrode array being provided in parallel to each other, upper surfaces and side wall surfaces of the transfer electrode array being covered with a light-shielding layer, and a transparent layer showing an oxidizing property at the time of film formation, the transparent layer being formed on the photo-electric conversion parts and the light-shielding layer, wherein an anti-oxidizing passivation layer is formed between the light-shielding layer and the transparent layer.

According to still another embodiment of the present invention, there is provided a camera using a solid state imaging device having a photo-electric conversion portion array including a plurality of photo-electric conversion parts and a transfer electrode array including a plurality of transfer electrodes, the photo-electric conversion portion array and the transfer electrode array being provided in parallel to each other, upper surfaces and side wall surfaces of the transfer electrode array being covered with a light-shielding layer, and a transparent layer showing an oxidizing property at the time of film formation, the transparent layer being formed on the photo-electric conversion parts and the light-shielding layer, wherein surfaces of portions covering upper surfaces of the transfer electrode array and portions covering upper regions of side wall surfaces of the transfer electrode array, of the light-shielding layer, are covered with a hard mask formed as an etching mask to be used in providing the light-shielding layer with openings corresponding to the photo-electric conversion parts by anisotropic etching; and an anti-oxidizing passivation layer is formed between surfaces of portions not covered with the hard mask, of the light-shielding layer, and the transparent layer, and between the surface of the hard mask and the transparent layer.

In the next place, in order to fulfill the above-mentioned another need, according to an embodiment of the present invention, there is provided a method of manufacturing a solid state imaging device having a photo-electric conversion portion array including a plurality of photo-electric conversion parts and a transfer electrode array including a plurality of transfer electrodes, the photo-electric conversion portion array and the transfer electrode array being provided in parallel to each other, upper surfaces and side wall surfaces of the transfer electrode array being covered with a light-shielding layer, and a transparent layer showing an oxidizing property at the time of film formation, the transparent layer being formed on the photo-electric conversion parts and the light-shielding layer, wherein the process of forming the light-shielding layer includes the steps of: forming a light-shielding layer material layer on a semiconductor substrate provided with the photo-electric conversion portion array and the transfer electrode array; forming a hard mask material layer on the light-shielding layer material layer; forming a photoresist material layer on the hard mask material layer; patterning the photoresist material layer so as to provide the photoresist material layer with openings corresponding to the photo-electric conversion parts, thereby forming a photoresist mask, in such a manner that edge portions of the openings formed in the photoresist material layer are aligned to within the range of thickness of the hard mask material layer covering the surface of the light-shielding layer material layer at the side wall surfaces of the transfer electrode array; subjecting the hard mask material layer to anisotropic etching by use of the photoresist mask as an etching mask so as to form a hard mask; and subjecting the light-shielding material layer to anisotropic etching by use of the hard mask as an etching mask so as to provide the light-shielding layer material layer with the openings corresponding to the photo-electric conversion parts.

According to another embodiment of the present invention, there is provided a solid state imaging device having a photo-electric conversion portion array including a plurality of photo-electric conversion parts and a transfer electrode array including a plurality of transfer electrodes, the photo-electric conversion portion array and the transfer electrode array being provided in parallel to each other, and upper surfaces and side wall surfaces of the transfer electrode array being covered with a light-shielding layer provided with openings corresponding to the photo-electric conversion parts, wherein surfaces of portions covering said upper surfaces of the transfer electrode array and portions covering said side wall surfaces of the transfer electrode array, of the light-shielding layer, are covered with a hard mask formed as an etching mask to be used in providing the light-shielding layer with the openings corresponding to the photo-electric conversion parts by anisotropic etching.

According to a further embodiment of the present invention, there is provided a camera using a solid state imaging device having a photo-electric conversion portion array including a plurality of photo-electric conversion parts and a transfer electrode array including a plurality of transfer electrodes, the photo-electric conversion portion array and the transfer electrode array being provided in parallel to each other, and upper surfaces and side wall surfaces of the transfer electrode array being covered with a light-shielding layer provided with openings corresponding to the photo-electric conversion parts, wherein surfaces of portions covering the upper surfaces of the transfer electrode array and portions covering said side wall surfaces of the transfer electrode array, of the light-shielding layer, are covered with a hard mask formed as an etching mask to be used in providing the light-shielding layer with the openings corresponding to the photo-electric conversion parts by anisotropic etching.

According to the present invention, the light-shielding layer covering the upper surfaces and side wall surfaces of the transfer electrode array are completely isolated by the anti-oxidizing passivation layer from the transparent layer showing an oxidizing property at the time of film formation. Therefore, those materials which have hitherto not been able to be used as a light-shielding layer material notwithstanding their high extinction coefficients because they are susceptible to oxidation can be used to form a light-shielding layer, whereby the thickness of the light-shielding layer can be largely reduced.

In addition, according to the present invention, in forming the light-shielding layer provided with the openings corresponding to the photo-electric conversion parts, a method of forming the openings by anisotropic etching using a photoresist mask as in the related-art method is not adopted; instead, a hard mask is first formed by anisotropic etching using a photoresist mask, and then the openings corresponding to the photo-electric conversion parts are formed in the light-shielding layer by anisotropic etching using the hard mask. Therefore, the misalignment in patterning of the photoresist mask in the manufacturing process can be absorbed by the thickness of the hard mask, without forming edge portions projecting largely from the lower ends of side wall surfaces of the transfer electrode array toward the photo-electric conversion parts at the peripheral edges of the openings formed in the light-shielding layer in correspondence with the photo-electric conversion parts. As a result, the reduction in the aperture area of the photo-electric conversion parts and the lowering in sensitivity can be obviated.

BRIEF DESCRIPTION OF THE DRAWINGS

FIGS. 7A and 7B are schematic enlarged sectional views of a light-shielding layer and a hard mask, for illustrating the process shown in FIGS. 6A to 6F;

DETAILED DESCRIPTION OF THE PREFERRED EMBODIMENTS

Figure 1:
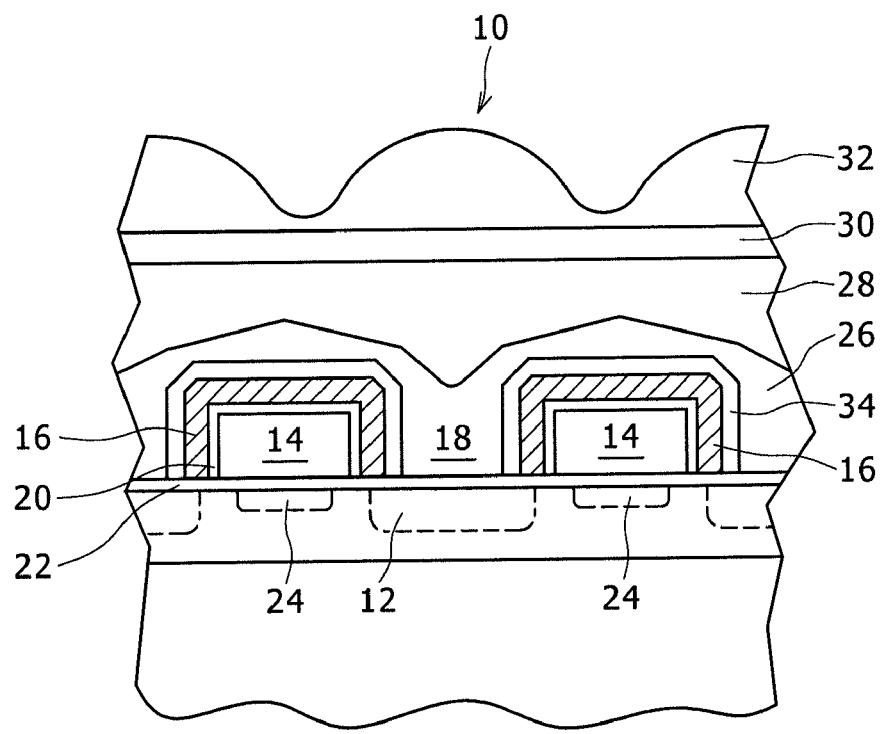
FIG. 1 is a schematic sectional view showing an essential part of a solid state imaging device according to a first embodiment of the present invention.
Figure 2:
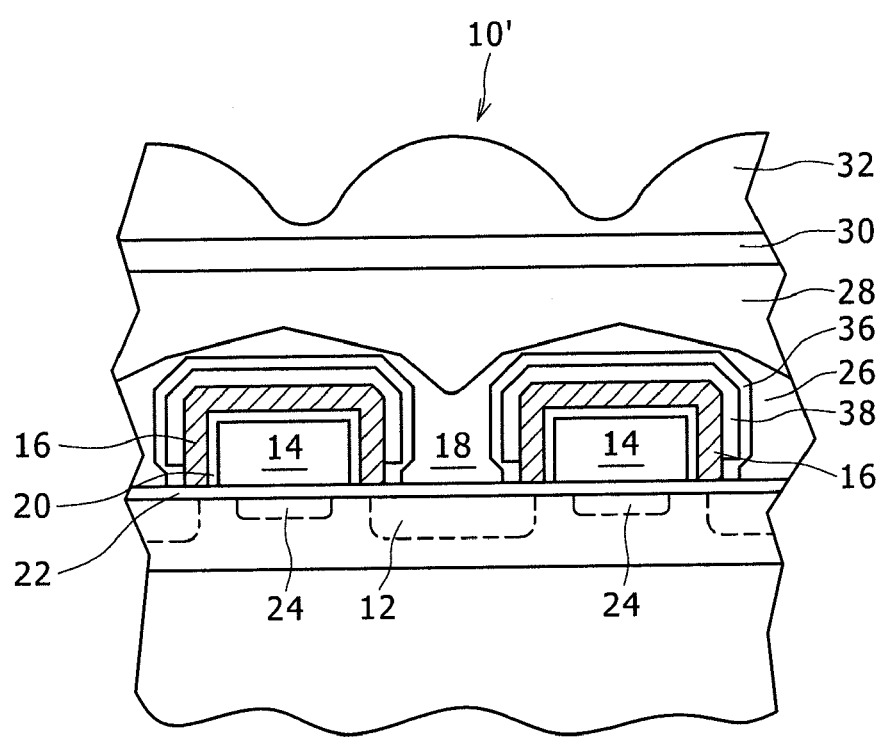
FIG. 2 is a schematic sectional view showing an essential part of a solid state imaging device according to a second embodiment of the present invention.

Now, embodiments of the present invention will be described below. FIG. 1 is a schematic sectional view showing an essential part of a solid state imaging device 10 according to a first embodiment of the present invention, and FIG. 2 is a schematic sectional view showing an essential part of a solid state imaging device 10' according to a second embodiment of the present invention. First, common configurations of the solid state imaging devices 10 and 10' will be described. The solid state imaging devices 10 and 10' are charge coupled devices (CCD), in which a photo-electric conversion portion array including a plurality of photo-electric conversion parts and a transfer electrode array including a plurality of transfer electrodes are provided in parallel to each other on a semiconductor substrate. The extending direction of the photo-electric conversion portion array and the transfer electrode array is the direction orthogonal to the sheet surface of the drawings. Upper surfaces and side wall surfaces of the transfer electrode array 14 are covered with a light-shielding layer 16 of ruthenium (Ru), and the light-shielding layer 16 is provided with openings 18 corresponding to the photo-electric conversion parts 12. Incidentally, the material of the light-shielding layer 16 may be other material than Ru. The upper surfaces and side wall surfaces of the transfer electrode array 14 are insulated from the light-shielding layer 16 by a layer insulating film 20, and the lower surfaces of the transfer electrode array 14 are insulated from charge transfer paths 24 therebeneath by another insulating film 22. Further, a first transparent layer 26 is formed on the photo-electric conversion parts 12 and the light-shielding layer 16, and a second transparent layer 28 different from the first transparent layer 26 in refractive index is formed on the first transparent layer 26. A color filter layer 30 is formed on the second transparent layer 28, and, further, an on-chip lens 32 is formed thereon.

The first and second transparent layers 26 and 28 are formed of boron phosphorus silicate glass (BPSG), and the compositions of the films are set different from each other so that the films have different refractive indices, whereby a refracting action is imparted to the interface between them, and a lens is thereby constituted. Incidentally, the material of the transparent layers is not limited to BPSG; for example, phosphorus silicate glass (PSG), arsenic glass (AsSG), or tetraethyl orthosilicate (TEOS)+ozone may be adopted as the material. The transparent layers formed of such a material show an oxidizing property at the time of film formation, and, particularly, they show a strong oxidizing property in a heating reflow step included in the film forming process. Therefore, if the transparent layer formed of such a material is formed directly on the light-shielding layer 16 formed of Ru or the like material susceptible to oxidation, the light shielding performance of the light-shielding layer 16 might be markedly damaged.

In view of this, in the solid state imaging device 10 shown in FIG. 1, an anti-oxidizing passivation layer 34 is formed between the light-shielding layer 16 formed of Ru and the first transparent layer 26 formed of BPSG. The passivation layer 34 is preferably formed as a film transparent to visible rays, by use of a material not containing oxygen, such as SiN, SiC, and SiCN. In this configuration, the light-shielding layer 16 is completely isolated from the first transparent layer 26 by the passivation layer 34, and, therefore, even if the first transparent layer 26 shows a strong oxidizing property at the time of film formation, the light shielding performance of the light-shielding layer 16 is not thereby damaged at all.

On the other hand, in the solid state imaging device 10' shown in FIG. 2, the surfaces of portions covering the upper surfaces of the transfer electrode array 14, of the light-shielding layer 16, and the surfaces of portions covering upper regions of side wall surfaces of the transfer electrode array 14, of the light-shielding layer 16, are covered with a hard mask 38. The hard mask 38 is formed as an etching mask to be used in providing the light-shielding layer 16 with the openings 18 corresponding to the photo-conversion parts 12 by anisotropic etching. As the material of the hard mask 38, for example, SiN, SiC, SiCN or the like is used, and, further, other materials may also be used. In addition, the region of removing the material of the light-shielding layer material layer by anisotropic etching conducted using the hard mask 38 is broadened to the lower side of lower end portions of the hard mask 38 covering the surface of the light-shielding layer material layer at the side wall surfaces of the transfer electrode array 14. This broadening is achieved by over-etching in conducting the anisotropic etching. As is clear from the figure, on the lower side of the lower end portions of the hard mask 38, the surface of the light-shielding layer 16 is not covered with the hard mask 38; therefore, the light shielding performance of the light-shielding layer 16 at the non-covered portions may be damaged at the time of forming the first transparent layer 26. In view of this, also in the solid state imaging device 10' shown in FIG. 2, an anti-oxidizing passivation layer 36 is formed. The passivation layer 36 is formed between the surfaces of portions, not covered with the hard mask 38, of the light-shielding layer 16 and the first transparent layer 26, and between the surface of the hard mask 38 and the first transparent layer 26. Like the passivation layer 34 in FIG. 1, the passivation layer 36 in FIG. 2 is preferably formed as a film transparent to visible rays, by use of a material not containing oxygen, such as SiN, SiC, and SiCN. In this configuration, the light-shielding layer 16 is completely isolated from the first transparent layer 26 by the hard mask 38 and the passivation layer 36; therefore, even if the first transparent layer 26 shows a strong oxidizing property at the time of film formation, the light shielding performance of the light-shielding layer 16 is not thereby damaged at all. Incidentally, the solid state imaging devices 10 and 10' are provided with not only the above-mentioned components but also other various components for permitting the devices to function as solid state imaging devices. However, these components are not intrinsic of the embodiments of the present invention, and may be provided with usual structures, and, therefore, description of these components is omitted.

As is clear from the foregoing, the solid state imaging device according to the embodiments of the present invention are so configured that the light shielding performance of the light-shielding layer is prevented from being damage by the transparent layer which shows an oxidizing property at the time of film formation. Therefore, the embodiments of the present invention are effective always when applied to a configuration in which the material of a light-shielding layer may otherwise be oxidized. For example, such metallic materials as Al, W, and Mo are not so susceptible to oxidation as Ru, but the light-shielding layers formed of these materials may also be encountered by the problem of degradation of light shielding performance due to oxidation, after the thinning of the film progresses further. Therefore, the embodiments of the present invention generally can display its effects when applied to solid state imaging devices in which a light-shielding layer is formed of a metallic material. It should be noted, however, that the materials such as Ru and Ir which have hitherto been not usable as a light-shielding layer material notwithstanding their high extinction coefficients because they are susceptible to oxidation are made to be usable by the embodiments of the present invention, and the light-shielding layer can thereby be much thinned, so that the effects of the embodiments of the present invention are particularly conspicuous when the embodiments of the invention are applied to the cases where the light-shielding layer material is Ru or Ir.

Furthermore, the present invention, in another state, provides various cameras such as digital still cameras, video cameras, and cameras having the functions of both types of cameras, and a camera pertaining to the embodiments of the present invention is a camera using a solid state imaging device according to the embodiments of the invention. A camera using a solid state imaging device itself is publicly known, and, therefore, when one skilled in the art is provided with the information about the solid state imaging device according to the embodiments of the present invention, he can easily manufacture a camera according to the embodiments of the present invention, based on the information.

FIGS. 3A to 3H are schematic views illustrating a main process in the method of manufacturing a solid state imaging device according to a first embodiment of the present invention, and FIGS. 4A to 4H are schematic views illustrating a main process in the method of manufacturing a solid state imaging device according to a second embodiment of the present invention. Of various processes constituting the method of manufacturing a solid state imaging device according to the embodiments of the present invention, the other processes than the processes shown in these figures are not processes intrinsic of the embodiments of the invention, and may be conducted according to the usual method; therefore, description of the other processes is omitted.

The main process in the method of manufacturing a solid state imaging device shown in FIGS. 3A to 3H is a process in manufacturing the solid state imaging device 10 shown in FIG. 1. As shown in FIG. 1, the height of the surfaces of the photo-electric conversion parts 12 on the semiconductor substrate is roughly at the same level as the height of the bottom surfaces of the transfer electrode array 14, so that the side wall surfaces of the transfer electrode array 14 covered with the light-shielding layer 16 are rising on both sides of each photo-electric conversion part 12.

Figure 3A:
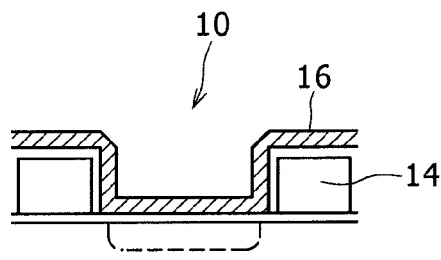
FIGS. 3A to 3H are schematic views illustrating a main process of a method of manufacturing a solid state imaging device according to a first embodiment of the present invention.
Figure 3E:
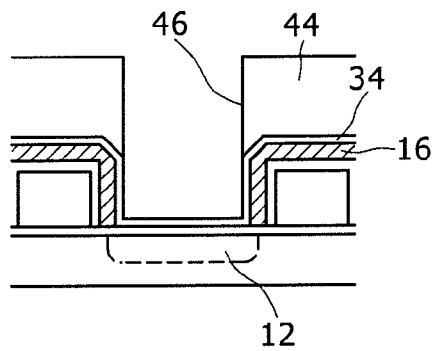
Figure 3B:
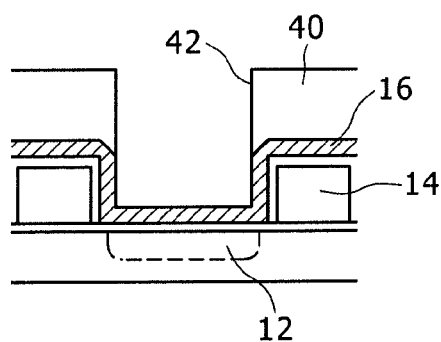
Figure 3F:
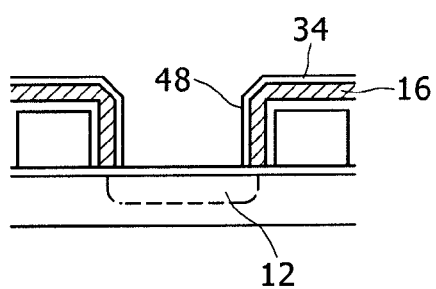
Figure 3C:
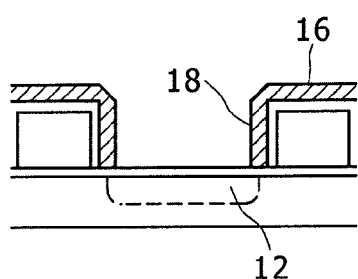

In the process shown in FIGS. 3A to 3H, first, for forming the light-shielding layer 16, a film of ruthenium (Ru) is formed on the semiconductor substrate provided with the photo-electric conversion array and the transfer electrode array, to form a light-shielding layer material layer (Ru layer) 16 (FIG. 3A). The forming of the Ru layer 16 may be conducted by sputtering, CVD or the like. Next, a photoresist mask 40 provided with openings 42 corresponding to the photo-electric conversion parts 12 is formed on the Ru layer 16 (FIG. 3B). Subsequently, anisotropic etching is applied to the Ru layer 16 by use of the photoresist mask 40 as an etching mask, to provide the Ru layer 16 with openings 18 corresponding to the photo-electric conversion parts 12. As a result, the light-shielding layer 16 is completed. Subsequently, ashing is conducted to remove the photoresist mask 40 (FIG. 3C).

Figure 3G:
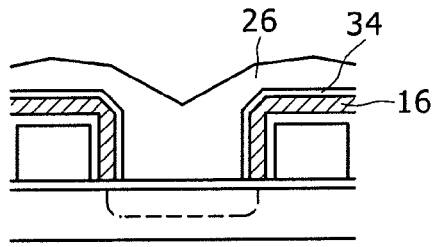
Figure 3D:
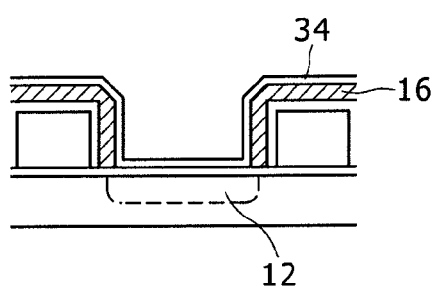
Figure 3H:
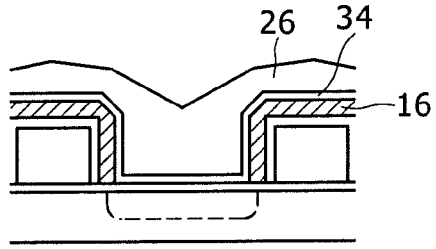

Next, an anti-oxidizing passivation layer 34 is formed on the photo-electric conversion parts 12 and the light-shielding layer 16 (FIG. 3D). The passivation layer 34 is preferably formed from a material not containing oxygen, such as SiN, SiC and SiCN. In addition, the passivation layer is preferably formed as a film transparent to visible rays, and may be formed by use of sputtering, CVD or the like method. Subsequently, a photoresist mask 44 having openings 46 corresponding to the photo-electric conversion parts 12 is formed on the passivation layer 34 (FIG. 3E). Next, anisotropic etching is applied to the passivation layer 34 by use of the photoresist mask 44 as an etching mask, to provide the passivation layer 34 with openings 48 corresponding to the photo-electric conversion parts 12 (i.e., the passivation layer 34 on the surfaces of the photo-electric conversion parts 12 is removed). Subsequently, ashing is conducted to remove the photoresist mask 44 (FIG. 3F). Thereafter, a first transparent layer 26 composed of BPSG or the like material is formed on the passivation layer 34 (FIG. 3G). Incidentally, in the above description, the removal of the passivation layer 34 present on the surfaces of the photo-electric conversion parts 12 is to reduce the number of interfaces between films differing in refractive index, to thereby reduce the reflection on the interfaces, and to increase the amount of light incident on the photo-electric conversion parts 12. However, where the reflection on the interface is so slight that it imposes no problem, the removing step may be omitted, and the formation of a first transparent layer 26 (FIG. 3H) may be conducted immediately from the condition of FIG. 3D.

The main process in the method of manufacturing a solid state imaging device shown in FIGS. 4A to 4H is a process in manufacturing the solid state imaging device 10' shown in FIG. 2. As shown in FIG. 2, the height of the surfaces of the photo-electric conversion parts 12 on the semiconductor substrate is roughly at the same level as the height of the bottom surfaces of the transfer electrode array 14, so that side wall surfaces of the transfer electrode array 14 covered with the light-shielding layer 16 are rising on both sides of each photo-electric conversion part 12.

Figure 4A:
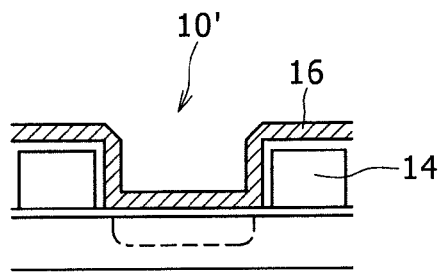
FIGS. 4A to 4H are schematic views illustrating a main process of a method of manufacturing a solid state imaging device according to a second embodiment of the present invention.
Figure 4B:
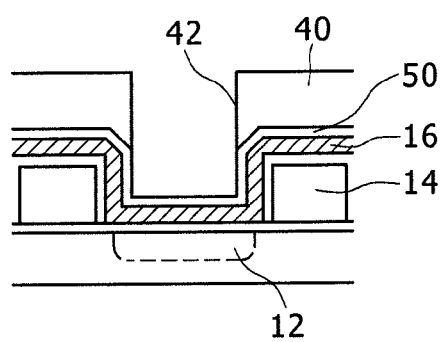

In the process illustrated in FIGS. 4A to 4H, first, for forming the light-shielding layer 16, a film of ruthenium (Ru) is formed on the semiconductor substrate provided with the photo-electric conversion portion array and the transfer electrode array, to form a light-shielding layer material layer (Ru layer) 16 (FIG. 4A). The forming of the Ru layer 16 may be conducted by use of sputtering, CVD or the like method. Next, an SiN layer 50 is formed on the Ru layer 16. The SiN layer 50 is formed for forming a hard mask 38, and is therefore a hard mask material layer. The forming of the SiN layer 50 may also be conducted by sputtering, CVD or the like method. Subsequently, a photoresist mask 40 having openings 42 corresponding to the photo-electric conversion parts 12 is formed (FIG. 4B).

Figure 4C:
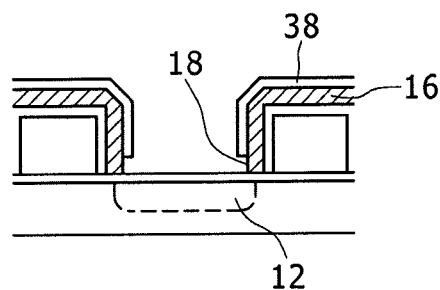

Next, anisotropic etching is applied to the SiN layer 50 by use of the photoresist mask 40 as an etching mask, to provide the SiN layer 50 with openings corresponding to the photo-electric conversion parts 12, whereby the hard mask 38 is completed. Subsequently, ashing is conducted to remove the photoresist mask 40. Furthermore, anisotropic etching is applied to the Ru layer 16 by use of the hard mask 38 as an etching mask, to provide the Ru layer 16 with openings 18 corresponding to the photo-electric conversion parts 12, whereby the light-shielding layer 16 is completed. The anisotropic etching applied to the Ru layer 16 is preferably conducted by impressing a bias voltage on a lower electrode in a dry etching apparatus while using a mixed gas containing Cl, $CF_2$, Ar or the like as an etching gas. The anisotropic etching applied to the Ru layer 16 is for cutting the Ru layer 16 by use of the hard mask 38 as an etching mask, so that the shape of the openings 18 thus formed is obtained through transfer of the corresponding shape of the hard mask 38. It is to be noted, however, that it is preferable that the anisotropic etching is not stopped upon transfer of the shape but further continued (i.e., over-etching is conducted). This ensures that even if the application of the bias voltage is being continued, a sufficient amount of the etching gas is supplied to the lower side of the lower end portions of the hard mask 38, so that the Ru layer 16 in these regions can also be cut and removed. Therefore, by conducting over-etching, as shown in FIG. 4C, the region of removing the material of the Ru layer 16 by anisotropic etching can be broadened to the lower side of the lower end portions of the hard mask 38 covering the surface of the W layer 16 at side wall surfaces of the transfer electrode array 14.

Figure 4D:
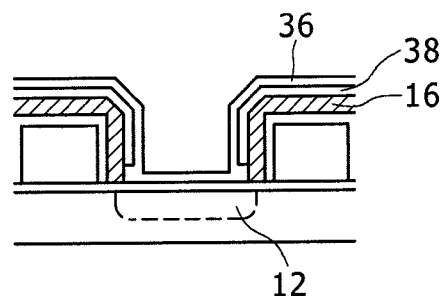
Figure 4E:
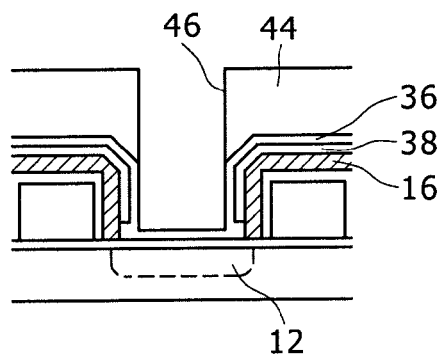
Figure 4F:
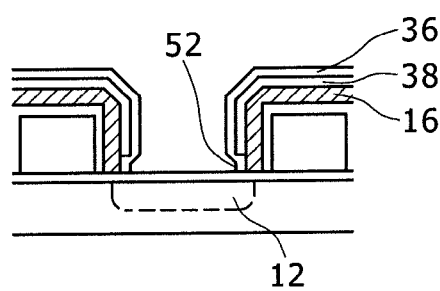
Figure 4G:
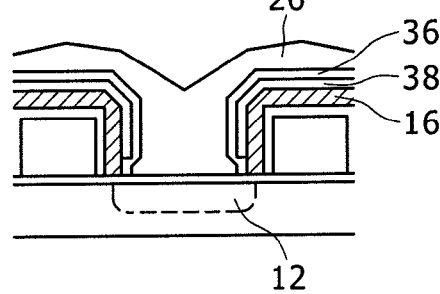
Figure 4H:
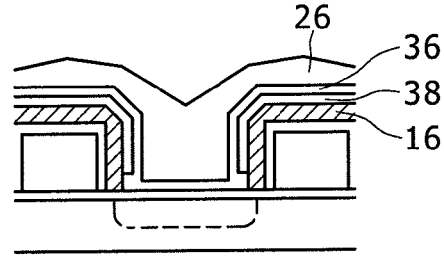

Next, an anti-oxidizing passivation layer 36 is formed on the hard mask 38, the photo-electric conversion parts 12, and the light-shielding layer 16 exposed on the lower side of the lower end portions of the hard mask 38 (FIG. 4D). The passivation layer 36 is preferably formed of a material not containing oxygen, such as SiN, SiC, and SiCN. In addition, the passivation layer 36 is preferably formed as a film transparent to visible rays, and may be formed by use of sputtering, CVD or the like method. Subsequently, a photoresist mask 44 provided with openings 46 corresponding to the photo-electric conversion parts 12 is formed on the passivation layer 36 (FIG. 4E). Next, anisotropic etching is applied to the passivation layer 34 by use of the photoresist mask 44 as an etching mask, to provide the passivation layer 36 with openings 52 corresponding to the photo-electric conversion parts 12 (i.e., the passivation layer 36 on the surfaces of the photo-electric conversion parts 12 is removed). Here, also, the region of removing the material of the passivation layer 36 by anisotropic etching is preferably broadened to the outer side by conducting over-etching, whereby the aperture area of the photo-electric conversion parts 12 is increased, leading to an enhanced sensitivity. Besides, with the openings 52 broadened, diffraction of light is suppressed, so that smear characteristic is also improved. Subsequently, ashing is conducted to remove the photoresist mask 44 (FIG. 4F). Thereafter, a first transparent layer 26 composed of BPSG or the like is formed on the passivation layer 36 (FIG. 4G). Incidentally, like in the process shown in FIG. 3, the step of removing the passivation layer 36 on the surfaces of the photo-electric conversion parts 12 may be omitted, and the formation of the first transparent layer 26 (FIG. 4H) may be conducted immediately from the condition of FIG. 4D.

As has been described above, according to the embodiments of the present invention, the light-shielding layer 16 covering the upper surfaces and side wall surfaces of the transfer electrode array 14 is completely isolated from the transparent layer 26 showing an oxidizing property at the time of film formation, by the anti-oxidizing passivation layers 34 and 36. Therefore, those materials which have hitherto been not usable as a light-shielding layer material notwithstanding their high extinction coefficients because they are susceptible to oxidation can be used, so that the thickness of the light-shielding layer can be much reduced.

Figure 5:
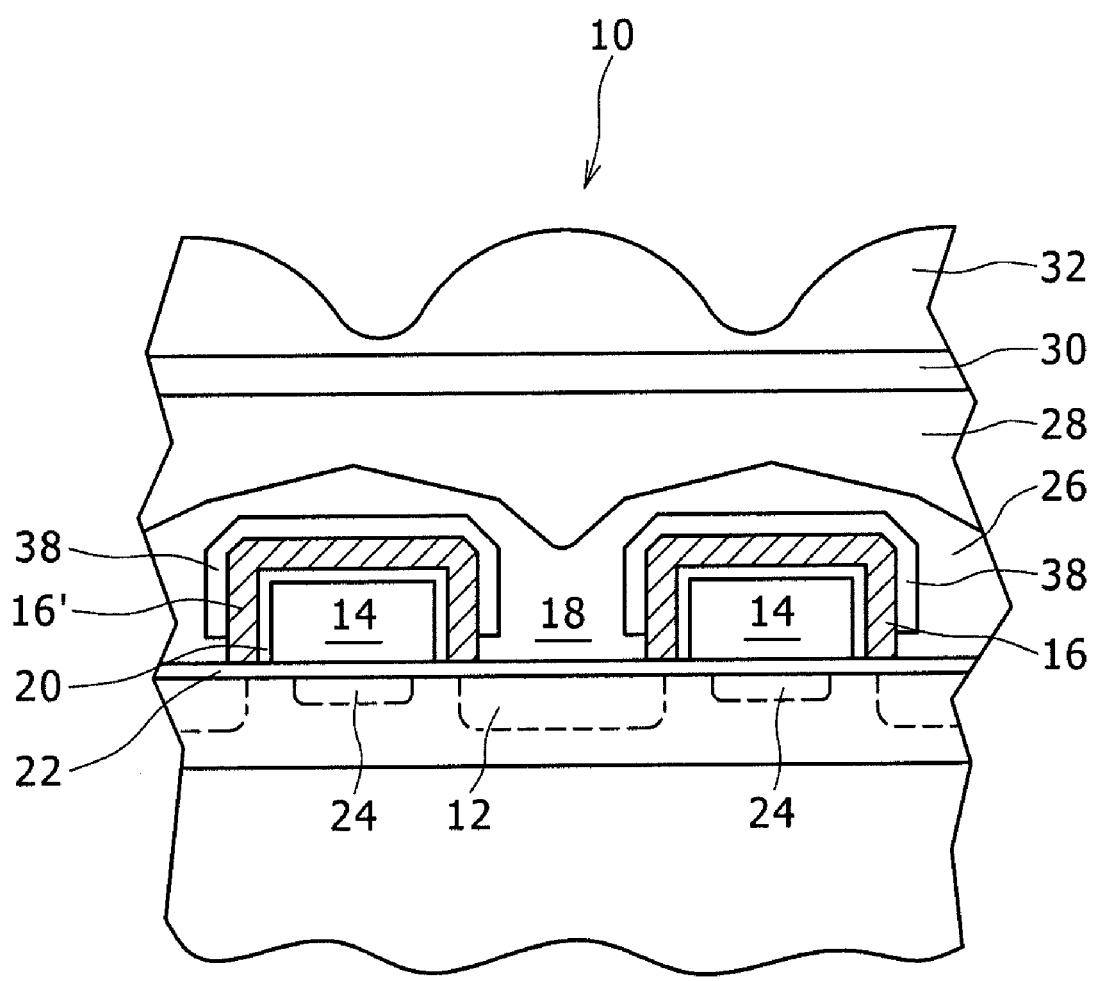
FIG. 5 is a schematic sectional view showing an essential part of a solid state imaging device according to a third embodiment of the present invention.

Now, a third embodiment of the present invention will be described. FIG. 5 is a schematic sectional view showing an essential part of a solid state imaging device 10 according to the third embodiment of the present invention. The solid state imaging device 10 as shown is a charge coupled device (CCD), in which a photo-electric conversion portion array including a plurality of photo-electric conversion parts and a transfer electrode array including a plurality of transfer electrodes are provided in parallel to each other on a semiconductor substrate. The extending direction of the photo-electric conversion portion array and the transfer electrode array is the direction orthogonal to the sheet surface of the drawing. Upper surfaces and side wall surfaces of the transfer electrode array 14 are covered with a light-shielding layer 16' of tungsten (W), and the light-shielding layer 16' is provided with openings 18 corresponding to the photo-electric conversion parts 12. Incidentally, the material of the light-shielding layer 16' may be other material than W. The upper surfaces and side wall surfaces of the transfer electrode array 14 are insulated from the light-shielding layer 16' by a layer insulating film 20, and the lower surfaces of the transfer electrode array 14 are insulated from charge transfer paths 24 therebeneath by another layer insulating film 22. Furthermore, a first transparent layer 26 is formed on the photo-electric conversion parts 12 and the light-shielding layer 16', and a second transparent layer 28 differing from the first transparent layer 26 in refractive index is formed on the first transparent layer 26. A color filter layer 30 is formed on the second transparent layer 28, and, further, an on-chip lens 32 is formed thereon. The first and second transparent layers 26 and 28 are formed of boron phosphorus silicate glass (BPSG), and by setting the compositions of both films to be different and thereby setting the refractive indices of the films to be different, a refractive action is imparted to the interface between the films, to thereby constitute a lens. Incidentally, the material of these transparent layers is not limited to BPSG; for example, phosphorus silicate glass (PSG), arsenic glass (AsSG), tetraethyl orthosilicate (TEOS)+ozone or the like may also be used. In addition, in order to set the interface between the films in a desired shape, it suffices, for example, to conduct a heating reflow step in forming the first transparent layer 26.

As is clear from the figures, the surfaces of portions covering the upper surfaces of the transfer electrode array 14, of the light-shielding layer 16', and the surfaces of portions covering upper regions of the side wall surfaces of the transfer electrode array 14, of the light-shielding layer 16', are covered with the hard mask 38, and the hard mask 38 is formed as an etching mask to be used in providing the light-shielding layer 16' with the openings 18 corresponding to the photo-electric conversion parts 12 by anisotropic etching. As the material of the hard mask 38, for example, $SiO_2$, SiN, SiON or the like is used. In addition, the region of removing the material of the light-shielding layer material layer by anisotropic etching using the hard mask 38 is broadened to the lower side of lower end portions of the hard mask 38 covering the surface of the light-shielding layer material layer at the side wall surfaces of the transfer electrode array 14. This broadening is achieved by conducting over-etching in carrying out the anisotropic etching. Incidentally, the solid state imaging device 10 is provided not only with the above-mentioned components but also with other various components for permitting the device to function as a solid state imaging device. The other components are not intrinsic of the embodiments of the present invention, and may be provided with the usual structures, and, therefore, description of the other components is omitted.

Furthermore, the embodiments of the present invention, in another state, provides various cameras such as digital still cameras, video cameras, and cameras having the functions of both types of cameras, and a camera pertaining to the embodiments of the present invention is a camera using a solid state imaging device according to the invention. A camera using a solid state imaging device itself is publicly known, and, therefore, when one skilled in the art is provided with the information about the solid state imaging device according to the embodiments of the present invention, he can easily manufacture a camera according to the embodiments of present invention, based on the information.

FIGS. 6A to 6F are schematic sectional views illustrating a process of forming a light-shielding layer in a method of manufacturing a solid state imaging device according to a third embodiment of the present invention, and FIGS. 7A and 7B are schematic enlarged sectional views of a light-shielding layer and a hard mask, for illustrating the process shown in FIGS. 6A to 6F. Of various processes constituting the method of manufacturing a solid state imaging device according to the embodiments of the present invention, the other processes than the process of forming a light-shielding layer are processes not intrinsic of the invention, and may be conducted according to the usual methods, and, therefore, description of the other processes is omitted.

The process of forming a light-shielding layer shown in FIGS. 6A to 6F is a process for forming the light-shielding layer 16' in the solid state imaging device 10 shown in FIG. 5. As shown in FIG. 5, the height of the surfaces of photo-electric conversion parts 12 on the semiconductor substrate is roughly at the same level as the height of the bottom surfaces of the transfer electrode array 14, so that side wall surfaces of the transfer electrode array 14 covered with the light-shielding layer 16' are rising on both side of each photo-electric conversion part 12.

Figure 6A:
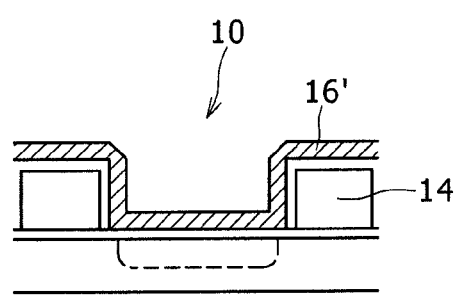
FIGS. 6A to 6F are schematic sectional views illustrating a process of forming a light-shielding layer in a method of manufacturing a solid state imaging device according to a third embodiment of the present invention.

In the process shown in FIGS. 6A to 6F, first, for forming the light-shielding layer 16', a film of tungsten (W) as a light-shielding layer material is formed on the semiconductor substrate provided with the photo-electric conversion portion array and the transfer electrode array, to form a light-shielding layer material layer (W layer) 16' (FIG. 6A). The forming of the W layer 16' may be conducted by sputtering, CVD or the like method. Incidentally, the materials which can be used for forming the light-shielding layer 16' include not only W but also various metallic materials such as Mo, Ta, Pt, Ru, Ir, Al, Ti, etc., alloys, and nitride or oxygen compounds thereof and the like.

Figure 6B:
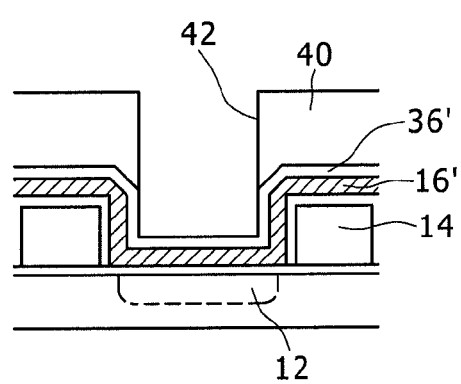

Next, an $SiO_2$ layer 36' is formed on the W layer 16' (FIG. 6B). The $SiO_2$ layer 36' is for forming a hard mask 38, and is therefore a hard mask material layer. The use of $SiO_2$ as the material of the hard mask 38 is based on the fact that the etching selectivity ratio of $SiO_2$ to W can be high preferably, in applying anisotropic etching to the W layer 16' by use of a dry etching apparatus as will be described later. It is to be noted, however, SiN, SiON and the like can also be used as the material of the hard mask 38. In addition, any other material can also be used inasmuch as the etching selectivity ratio of the material to W can be high and a film of the material can be formed conformally on the W layer 16' by CVD or the like method.

The thickness of the hard mask 38 (hence, the thickness of the $SiO_2$ layer 36' formed as the hard mask material layer) is determined according to such factors as accuracy of patterning applied to a photoresist material layer to be described later, the etching selectivity ratio of $SiO_2$ to W, etc., and this will be described in detail later.

Figure 6C:
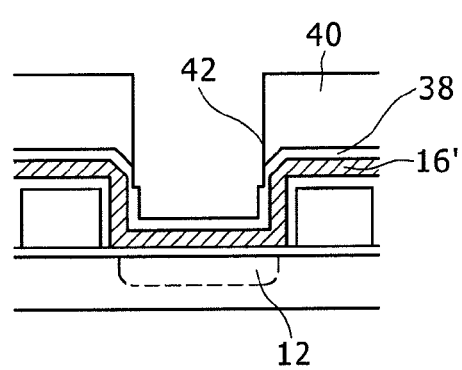

Next, a photoresist material layer is formed on the hard mask material layer 36', the photoresist material layer is patterned by photolithography to provide the photoresist material layer with openings 42 corresponding to the photo-electric conversion parts 12, to form a photoresist mask 40 (FIG. 6C). Besides, in the patterning, as shown in FIG. 7A, an alignment is conducted such that an edge portion R of the opening 42 formed in the photoresist material layer is set within the range of the thickness T of the hard mask material layer 36' covering the surface of the W layer 16' at the side wall surface of the transfer electrode array 14. Misalignment in patterning of the photoresist mask is inevitable; however, according to this aligning step, it suffices that the edge portion R of the opening 42 formed in the photoresist material layer is located within the range of the thickness T of the hard mask material layer 36' covering the surface of the W layer 16' at the side wall surface of the transfer electrode array 14, so that the accuracy required in the patterning of the photoresist mask 40 is low, and such a level of alignment can be carried out easily and assuredly. Upon such an alignment, the hard mask material layer 36' is configured as shown in FIG. 7A, in which of the range of the thickness T thereof covering the surface of the W layer 16' at the side wall surface of the transfer electrode array 14, only the portion OT on the face side is exposed from the photoresist mask 40, and the portion IT on the inner side (the W layer 16' side) is covered with the photoresist 40.

Figure 6D:
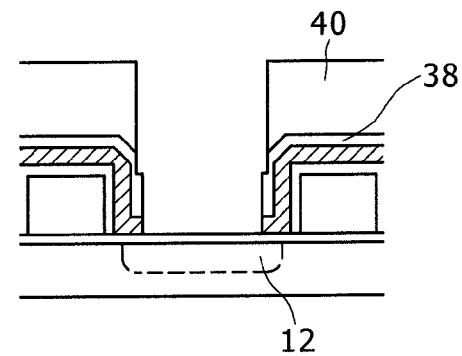

Subsequently, anisotropic etching is applied to the hard mask material layer 36' by use of the photoresist mask 40 as an etching mask, to form a hard mask 38 (FIG. 6D). In this instance, the etching amount of the hard mask material layer 361 is set at such a level as to be necessary for removing the thickness portion of the hard mask material layer 36' covering the surface of the photo-electric conversion part 12. As a result, as shown in FIG. 7B, of the hard mask material layer 36', the portion OT exposed from the photoresist mask 40 is cut away over a height H roughly corresponding to the hard mask material layer 36' covering the surface of the photo-electric conversion part 12. However, since the height of the side wall surface of the transfer electrode array 14 is sufficiently larger than the height H of the portion cut away, the lower end portion of the hard mask 38 can retain its original shape, without being cut away by the anisotropic etching.

Figure 6E:
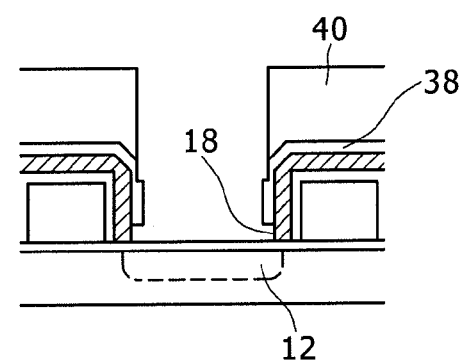

Next, by use of the thus-formed hard mask 38 as an etching mask, anisotropic etching is applied to the W layer 16' present as the light-shielding layer material layer, to provide the W layer 16' with openings 18 corresponding to the photo-electric conversion parts 12 (FIG. 6E). The anisotropic etching applied to the W layer 16' is preferably conducted by applying a bias voltage to a lower electrode of a dry etching apparatus while using a mixed gas of Cl, $CF_2$, Ar or the like as an etching gas; however, an etching gas in which $O_2$, $N_2$ or the like is mixedly present may also be used without any problem. Since the anisotropic etching applied to the W layer 16' is an etching for cutting the W layer 16' by using the hard mask 38 as an etching mask, the shape of the openings 18 thus formed have a shape obtained by transfer of the shape of the hard mask 38. Moreover, the shape of the hard mask 38 thus transferred is the shape of the lower end portions of the hard mask 38, which is maintained without being cut by the anisotropic etching conducted for forming the hard mask 38. Therefore, though misalignment in the patterning of the photoresist mask 40 is inevitable, the shape, size and positions of the openings 18 formed in the light-shielding layer 16' by the above-mentioned process are completely relieved from the influence of the misalignment, so that the openings 18 in the light-shielding layer 16' can be formed with high accuracy.

Figure 6F:
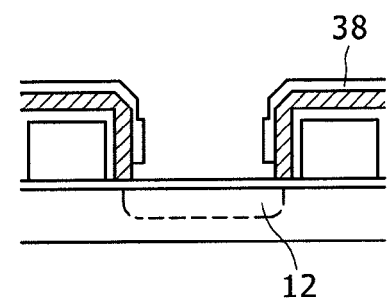

Furthermore, when the anisotropic etching is continued after the removal of the W layer 16' present on the surfaces of the photo-electric conversion parts 12 (over-etching is conducted), a sufficient amount of the etching gas is supplied to the lower side of the lower end portions of the hard mask 38 even if the application of the bias voltage is continued, so that the W layer 16' in these regions can also be cut away and removed. Therefore, by conducting the over-etching, as shown in FIG. 6E, the region of removing the W layer 16' by the anisotropic etching can be broadened to the lower side of the lower end portions of the hard mask 38 covering the surface of the W layer 16' at side wall surfaces of the transfer electrode array 14. As a result, the size of the openings 18 can be uniformly enlarged without disordering the shape of the openings 18, so that the aperture area of the openings 18 is increased, leading to an enhanced sensitivity. In addition, since diffraction of light is suppressed by the broadening of the openings 18, smear characteristic is also improved. When the light-shielding layer 16' is completed in the above-mentioned manner, ashing is subsequently conducted, to remove the photoresist mask (FIG. 6F).

Here, the thickness of the hard mask 38 (hence, the thickness of the $SiO_2$ layer 36, formed as the hard mask material layer) will be described more in detail. The method of manufacturing a solid state imaging device according to an embodiment of the present invention is a method in which the misalignment in patterning of a photoresist is brought to within the range of the thickness T of the hard mask material layer 36' covering the surface of the W layer 16' at side wall surfaces of the transfer electrode array 14, whereby the misalignment is absorbed. Therefore, as the thickness T of the hard mask material layer 36' is set larger, the margin for the misalignment can be made greater. However, when the thickness T is too large, the etching time in removing the W layer 16' to the lower side of the lower ends of the hard mask 38 becomes long, and the shape of the opening 18 formed in the light-shielding layer 16' is thereby disordered, unfavorably. The magnitude of the misalignment depends mainly on the performance of the exposure machine used in lithography, while the etching time and the shape of the openings formed depend mainly on the performance of the etching apparatus. Therefore, in consideration of the performances of the exposure machines and the etching apparatuses in general use at present, the thickness of the hard mask 38 is desirably in the range of about 40 to 120 nm.

It is to be noted, however, the thickness of the hard mask 38 may constitute a factor for narrowing the aperture area of the photo-electric conversion parts 12, and, therefore, it is preferable to set the thickness as small as possible, for enhancing the performance of the solid state imaging device 10. In order to reduce the thickness of the hard mask 38, it is desirable to suppress the misalignment in patterning of the photoresist mask. For this purpose, a back anti-reflection coat (BARC) may be formed on the hard mask material layer 36' and the photoresist material layer may be formed thereon, whereby light reflection and its scattering at the time of light exposure can be suppressed by the BARC, so that a misalignment-reducing effect is obtained. FIGS. 8A to 8G are schematic sectional views illustrating a process of forming a light-shielding layer according to a modified embodiment, in which a modification consisting in forming the BARC is applied to the process shown in FIGS. 6A to 6F.

Figure 8A:
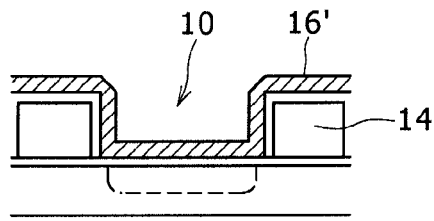
FIGS. 8A to 8G are schematic sectional views illustrating a process of forming a light-shielding layer according to a modified example, in which a BARC is formed by modifying the process shown in FIGS. 6A to 6F.
Figure 8B:
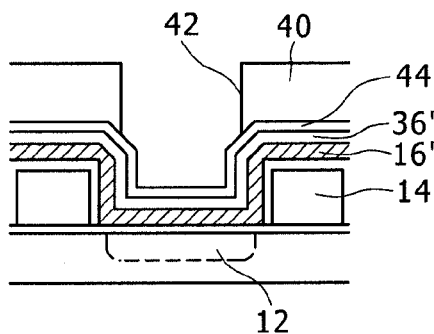

In the process illustrated in FIGS. 8A to 8G, first, a W layer 16' as a light-shielding layer material layer is formed on a semiconductor substrate provided with a photo-electric conversion portion array and a transfer electrode array 14 (FIG. 8A). Incidentally, the material of the light-shielding layer 16' may be other material than W. Next, a hard mask material layer 36' is formed on the W layer 16', a BARC 44 is formed on the hard mask material layer 36', and further a photoresist material layer is formed thereon. Then, the photoresist material layer is patterned by photolithography, to provide the photoresist material layer with openings 42 corresponding to the photo-electric conversion parts 12, thereby forming a photoresist mask 40 (FIG. 8B). Besides, in the patterning, like in the process of FIGS. 6A to 6F, an alignment is conducted such that edge portions of the openings 42 to be formed in the photoresist material layer are brought to within the range of the thickness of the hard mask material layer 36' covering the surface of the W layer 16' at side wall surfaces of the transfer electrode array 14.

Figure 8E:
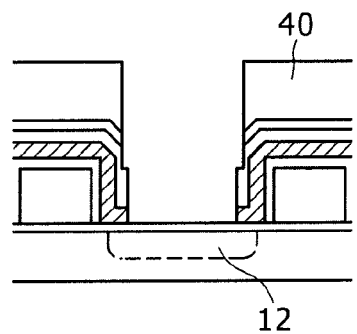
Figure 8C:
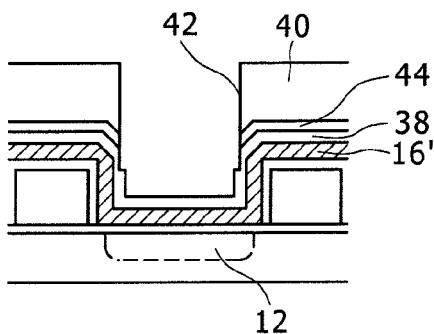
Figure 8F:
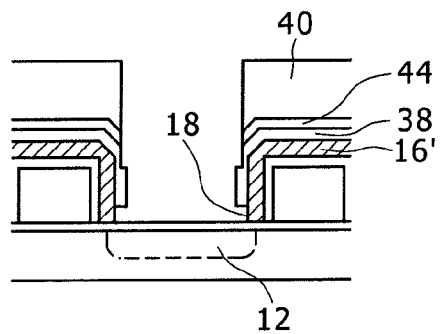
Figure 8D:
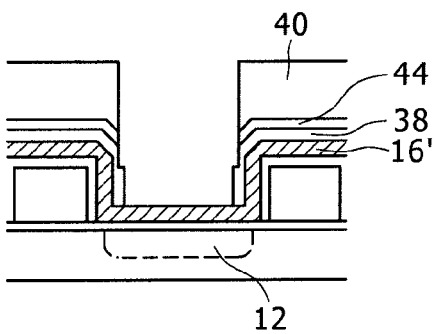
Figure 8G:
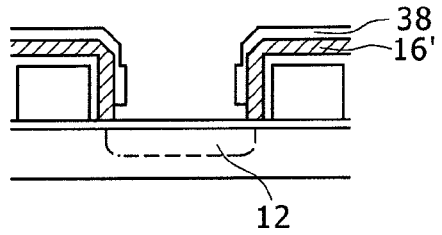
Figure 9A:
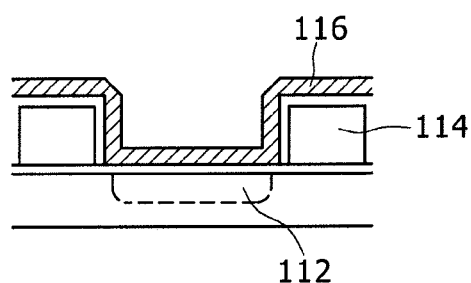
FIGS. 9A to 9F are schematic sectional views illustrating a related-art process of forming a light-shielding layer covering a transfer electrode array.
Figure 9B:
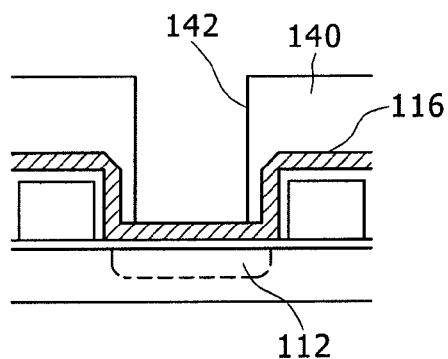
Figure 9C:
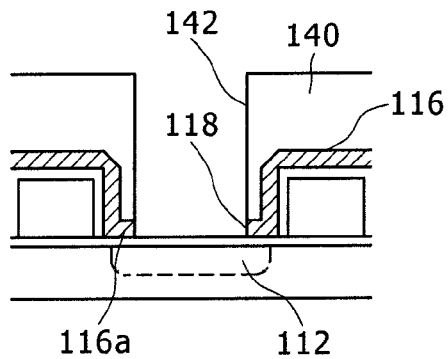
Figure 9D:
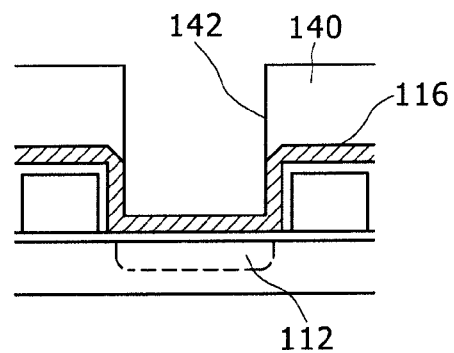
Figure 9E:
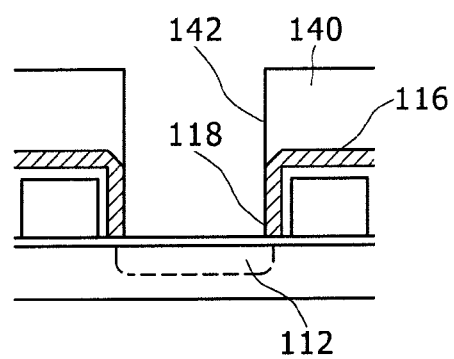
Figure 9F:
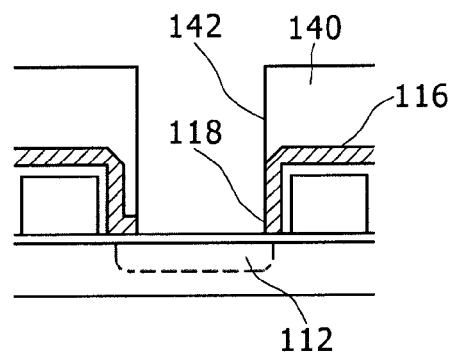

Next, using the photoresist mask 40 as an etching mask, the BARC 44 is etched, to thereby remove the exposed portions of the BARC 44 (FIG. 8C). Furthermore, using the photoresist mask 40 as an etching mask, anisotropic etching is applied to the hard mask material layer 36', to thereby form a hard mask 38 (FIG. 8D). Subsequently, using the thus formed hard mask 38 as an etching mask, anisotropic etching is applied to the W layer 16' present as a light-shielding layer material layer, to provide the W layer 16' with openings 18 corresponding to the photo-electric conversion parts 12 (FIG. 8E). The anisotropic etching applied to the W layer 16' may be conducted in the same manner as in the process of FIGS. 6A to 6F. Further, after the removal of the W layer 16' present on the surfaces of the photo-electric conversion parts 12, the anisotropic etching is continued (over-etching is conducted), whereby the region of removing the W layer 16' by the anisotropic etching is broadened to the lower side of lower end portions of the hard mask 38 covering the surface of the W layer 16' at side wall surfaces of the transfer electrode array 14, as shown in FIG. 8F. When the light-shielding layer 16' is completed in this manner, ashing is subsequently conducted to remove the BARC and the photoresist (FIG. 8G).

As has been described above, according to the embodiments of the present invention, in providing the light-shielding layer 16' with the openings 18 corresponding to the photo-electric conversion parts 12, a method of forming the openings by anisotropic etching conducted using a photoresist mask as in the related-art method is not adopted, but, instead, the hard mask 38 is formed by anisotropic etching conducted by use of a photoresist mask, and the openings 18 corresponding to the photo-electric conversion parts 12 are formed in the light-shielding layer 16' by anisotropic etching conducted using the hard mask 38. Therefore, the misalignment in patterning of the photoresist mask in the manufacturing process can be absorbed by the thickness of the hard mask 38, without formation of edge portions projecting largely from the lower ends of side wall surfaces of the transfer electrode array 14 toward the photo-electric conversion parts 12, at the peripheral edges of the openings 18 formed in the light-shielding layer 16' in correspondence with the photo-electric conversion parts 12. This makes it possible to obviate a reduction in the aperture area of the photo-electric conversion parts and a lowering in sensitivity. In addition, in providing the light-shielding layer 16' with the openings 18 corresponding to the photo-electric conversion parts 12 by the anisotropic etching conducted by use of the hard mask 38, over-etching is conducted, whereby the region of removing the material of the light-shielding layer material layer by the anisotropic etching can be broadened to the lower side of the lower end portions of the hard mask 38 covering the surface of the light-shielding layer material layer at side wall surfaces of the transfer electrode array 14. As a result, the size of the openings 18 can be uniformly enlarged without disordering the shape of the openings 18, so that the aperture area of the photo-electric conversion parts 12 is increased, leading to an enhanced sensitivity. In addition, the broadening of the openings reduces the diffracted light, whereby leakage of light into transfer channels is suppressed, and smear characteristic is improved.

While preferred embodiments of the present invention have been described using specific terms, such description is for illustrative purpose only, and it is to be understood that changes and variations may be made without departing from the spirit or scope of the following claims.

What is claimed is:

1. A method of manufacturing a solid state imaging device comprising a photo-electric conversion portion array including a plurality of photo-electric conversion parts and a transfer electrode array including a plurality of transfer electrodes, said photo-electric conversion portion array and said transfer electrode array being provided in parallel to each other, upper surfaces and side wall surfaces of said transfer electrode array being covered with a light-shielding layer, and a transparent layer showing an oxidizing property at the time of film formation, said transparent layer being formed on said photo-electric conversion parts and said light-shielding layer, wherein the process of forming said light-shielding layer comprises the steps of forming a light-shielding layer material layer on a semiconductor substrate provided with said photo-electric conversion portion array and said transfer electrode array;

forming a hard mask material layer on said light-shielding layer material layer;

forming a photoresist material layer on said hard mask material layer;

patterning said photoresist material layer so as to provide said photoresist material layer with openings corresponding to said photo-electric conversion parts, thereby forming a photoresist mask, in such a manner that edge portions of said openings formed in said photoresist material layer are aligned with said hard mask material layer covering said light-shielding layer material layer at said side wall surfaces of said transfer electrode array;

subjecting said hard mask material layer to anisotropic etching by use of said photoresist mask as an etching mask so as to form a hard mask; and subjecting said light-shielding material layer to anisotropic etching by use of said hard mask as an etching mask so as to provide said light-shielding layer material layer with said openings corresponding to said photo-electric conversion parts.

2. The method of manufacturing a solid state imaging device as set forth in claim 1, wherein in said anisotropic etching of said light-shielding layer material layer, over-etching is conducted, whereby the region of removal of the material of said light-shielding layer material layer by said anisotropic etching is broadened to the lower side of lower end portions of said hard mask covering the surface of said light-shielding layer material layer at said side wall surfaces of said transfer electrode array.

3. The method of manufacturing a solid state imaging device as set forth in claim 1, wherein in forming said photoresist material layer on said hard mask material layer, a back anti-reflection film is formed on said hard mask material layer, and said photoresist material layer is formed thereon.

4. The method of manufacturing a solid state imaging device as set forth in claim 1, wherein $SiO_2$, SiN, or SiON is used as a material of said hard mask.

5. A solid state imaging device comprising a photo-electric conversion portion array including a plurality of photo-electric conversion parts and a transfer electrode array including a plurality of transfer electrodes, said photo-electric conversion portion array and said transfer electrode array being provided in parallel to each other, and upper surfaces and side wall surfaces of said transfer electrode array being covered with a light-shielding layer provided with openings corresponding to said photo-electric conversion parts, wherein surfaces of portions covering said upper surfaces of said transfer electrode array and portions covering said side wall surfaces of said transfer electrode array, and of said light-shielding layer, are covered with a hard mask formed as an etching mask to be used in providing said light-shielding layer with said openings corresponding to said photo-electric conversion parts by anisotropic etching, wherein the hard mask does not extend to lowest portions of the light shielding layer.

6. The solid state imaging device as set forth in claim 5, wherein the region of removal of the material of said light-shielding layer material layer by said anisotropic etching is broadened to the lower side of lower end portions of said hard mask covering the surface of said light-shielding layer material layer at said side wall surfaces of said transfer electrode array.

7. A solid state imaging device as set forth in claim 5, wherein said hard mask is formed of $SiO_2$, SiN, or SiON.

8. A camera using a solid state imaging device comprising a photo-electric conversion portion array including a plurality of photo-electric conversion parts and a transfer electrode array including a plurality of transfer electrodes, said photo-electric conversion portion array and said transfer electrode array being provided in parallel to each other, and upper surfaces and side wall surfaces of said transfer electrode array being covered with a light-shielding layer provided with openings corresponding to said photo-electric conversion parts, wherein surfaces of portions covering said upper surfaces of said transfer electrode array and portions covering said side wall surfaces of said transfer electrode array, and of said light-shielding layer, are covered with a hard mask formed as an etching mask to be used in providing said light-shielding layer with said openings corresponding to said photo-electric conversion parts by anisotropic etching, wherein the hard mask does not extend to lowest portions of the light shielding layer.

9. The camera using a solid state imaging device as set forth in claim 8, wherein the region of removal of the material of said light-shielding layer material layer by said anisotropic etching is broadened to the lower side of lower end portions of said hard mask covering the surface of said light-shielding layer material layer at said side wall surfaces of said transfer electrode array.

10. The camera using a solid state imaging device as set forth in claim 8, wherein said hard mask is formed of $SiO_2$, SiN, or SiON.

\* \* \* \* \*